United States Patent
Lee et al.

(10) Patent No.: US 12,206,077 B2
(45) Date of Patent: *Jan. 21, 2025

(54) BATTERY SAFETY TEST DEVICE AND METHOD

(71) Applicant: LG ENERGY SOLUTION, LTD., Seoul (KR)

(72) Inventors: Won Hyeok Lee, Daejeon (KR); Hyung Jin Hwang, Daejeon (KR); Seong Ha Cha, Daejeon (KR); Ui Yong Jeong, Daejeon (KR); In Cheol Shin, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/400,487

(22) Filed: Dec. 29, 2023

(65) Prior Publication Data

US 2024/0136604 A1    Apr. 25, 2024
US 2024/0234839 A9    Jul. 11, 2024

Related U.S. Application Data

(63) Continuation of application No. 17/420,161, filed as application No. PCT/KR2020/003652 on Mar. 17, 2020, now Pat. No. 11,909,009.

(30) Foreign Application Priority Data

Mar. 19, 2019    (KR) .................. 10-2019-0031403

(51) Int. Cl.
*H01M 10/42*    (2006.01)
*G01R 31/36*    (2020.01)
(Continued)

(52) U.S. Cl.
CPC .... *H01M 10/4285* (2013.01); *G01R 31/3648* (2013.01); *G01R 31/3842* (2019.01);
(Continued)

(58) Field of Classification Search
CPC ............. H01M 10/4285; H01M 10/48; G01R 31/385; G01R 31/3648; G01R 31/3842; H02J 7/0029
(Continued)

(56) References Cited

U.S. PATENT DOCUMENTS 5,557,189 A     9/1996 Suzuki et al.
11,233,298 B2 * 1/2022 Hinterberger ....... H01M 10/613
(Continued)

FOREIGN PATENT DOCUMENTS

CN    105954685 A    9/2016
JP    S3-28364       3/1978
(Continued)

OTHER PUBLICATIONS

International Search Report (PCT/ISA/210) issued in PCT/KR2020/003652 mailed on Jun. 22, 2020.
(Continued)

*Primary Examiner* — Alexander Satanovsky
*Assistant Examiner* — Trung Q Nguyen
(74) *Attorney, Agent, or Firm* — Birch, Stewart, Kolasch & Birch, LLP

(57) ABSTRACT

The present invention provides a battery safety test device includes: a mechanical switch element having one end connected to either a battery positive or negative electrode and the other end connected to an electronic switching element; the electronic switching element having one end connected to the mechanical switch element and the other end connected to the other of the battery positive or negative electrode; a voltage sensor for measuring a voltage of the
(Continued)

battery after the mechanical switch element and the electronic switching element are turned on; and a current sensor for measuring a current of the battery after the mechanical switch element and the electronic switching element are turned on.

11 Claims, 8 Drawing Sheets

(51) Int. Cl.
*G01R 31/3842* (2019.01)
*G01R 31/385* (2019.01)
*H01M 10/48* (2006.01)
*H02J 7/00* (2006.01)

(52) U.S. Cl.
CPC .......... *G01R 31/385* (2019.01); *H01M 10/48* (2013.01); *H02J 7/0029* (2013.01)

(58) Field of Classification Search
USPC ............. 324/76.11, 415, 425–434, 126, 500, 324/756.05, 538
See application file for complete search history.

(56) References Cited

U.S. PATENT DOCUMENTS

| | | | |
|---|---|---|---|
| 2016/0190836 A1* | 6/2016 | Sun | G01R 31/3835 320/134 |
| 2018/0031637 A1 | 2/2018 | Tsai | |
| 2018/0138000 A1 | 5/2018 | Morita | |
| 2018/0228001 A1* | 8/2018 | Hsia | H05B 45/36 |
| 2019/0252977 A1 | 8/2019 | Yokoyama | |
| 2020/0106082 A1 | 4/2020 | Fukushima et al. | |
| 2020/0168929 A1 | 5/2020 | Tanaka | |
| 2022/0113381 A1* | 4/2022 | Yamamoto | B60S 1/026 |
| 2022/0413061 A1* | 12/2022 | Nakayama | H02H 3/044 |

FOREIGN PATENT DOCUMENTS

| | | |
|---|---|---|
| JP | 2005-100924 A | 4/2005 |
| JP | 2010-17462 A | 1/2010 |
| JP | 2014-27775 A | 2/2014 |
| JP | 2015-61456 A | 3/2015 |
| JP | 2015-90745 A | 5/2015 |
| JP | 2015-108605 A | 6/2015 |
| JP | 5839137 B1 | 1/2016 |
| JP | 2016-170022 A | 9/2016 |
| JP | 6011707 B1 | 10/2016 |
| JP | WO2016/194584 A1 | 12/2016 |
| JP | 2017-126467 A | 7/2017 |
| KR | 10-0328190 B1 | 6/2002 |
| KR | 10-1443744 B1 | 9/2014 |
| KR | 10-1546715 B1 | 8/2015 |
| KR | 10-1858990 B1 | 5/2018 |
| KR | 10-2018-0098852 A | 9/2018 |
| KR | 10-1927845 B1 | 12/2018 |

OTHER PUBLICATIONS

Tsuyoshi Horita, "Safety Test Results of Lithium-ion Batteries", The 2017 Annual Meeting record I.E.E. Japan, vol. 7, pp. 52-53.

* cited by examiner

[FIG. 1]
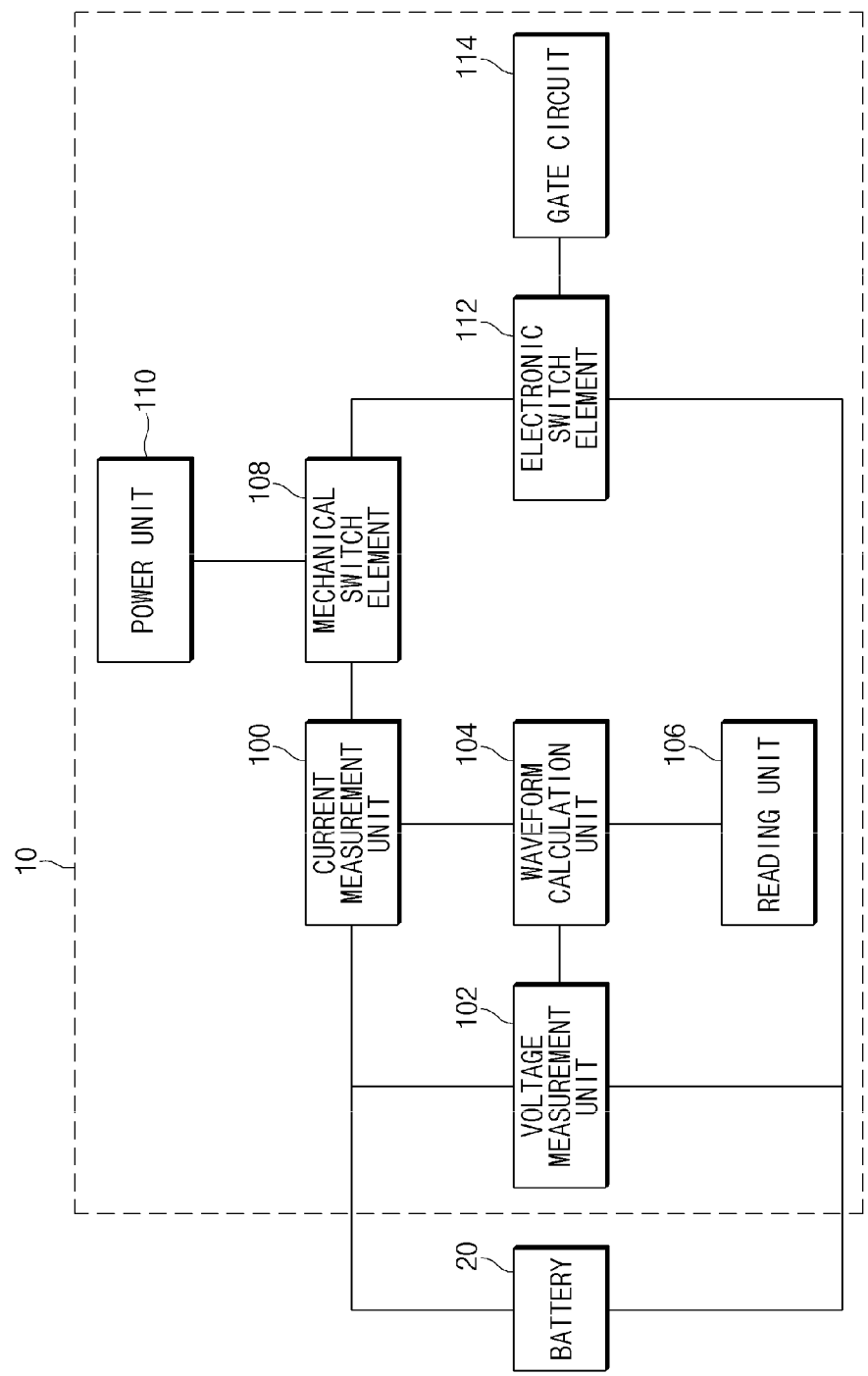

[FIG. 2A]
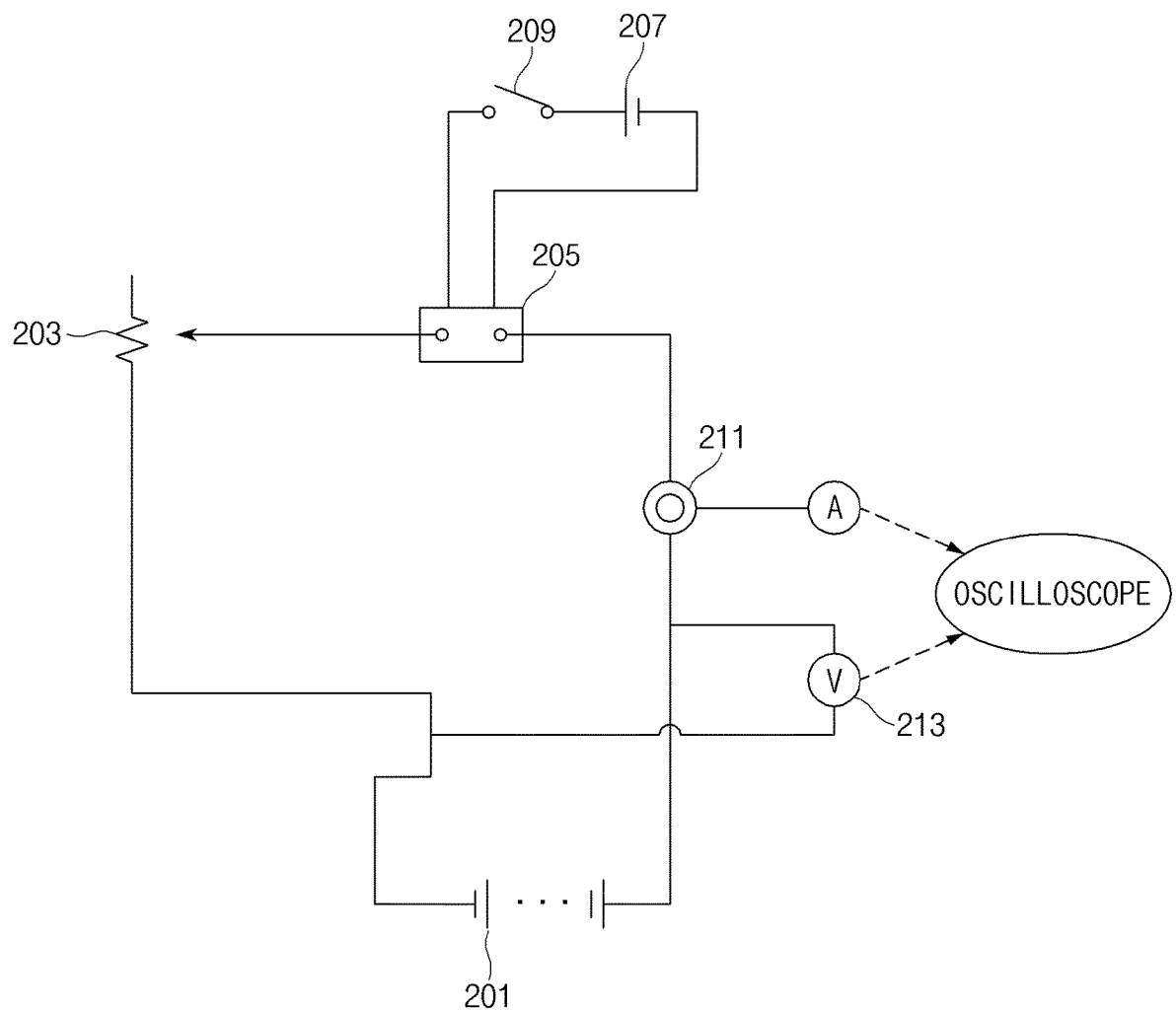
Conventional Art

[FIG. 2B]
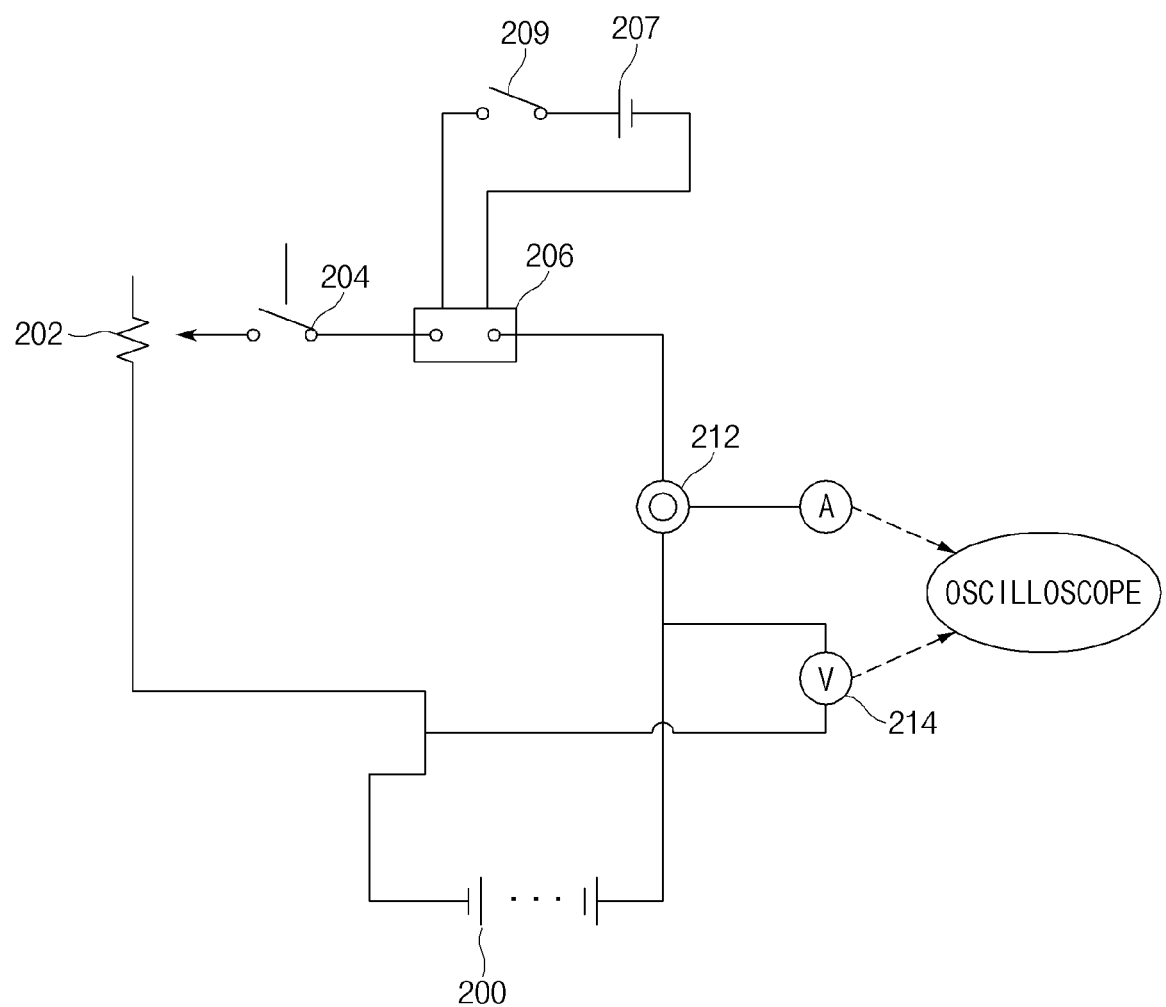

[FIG. 2C]
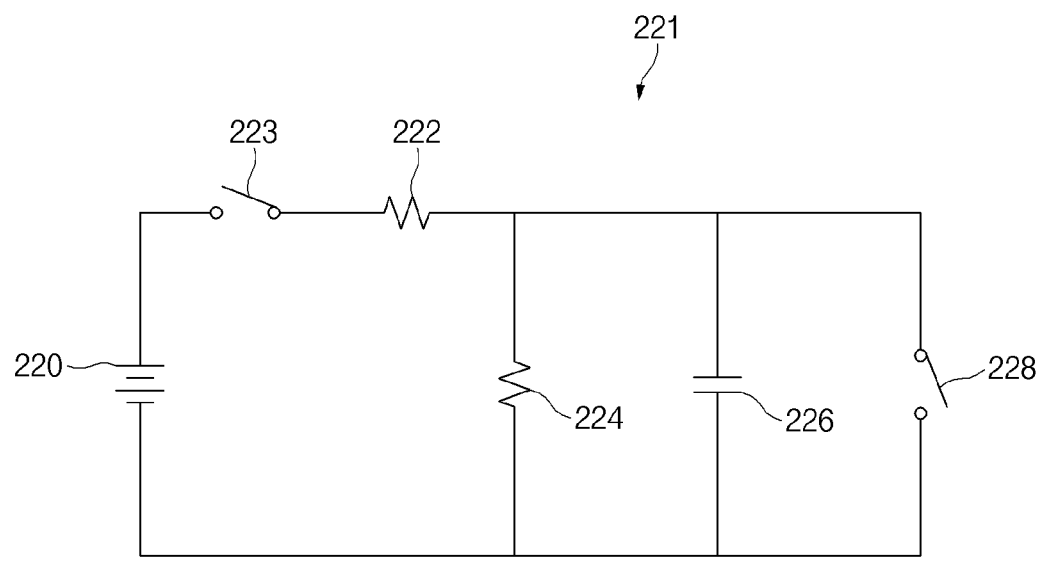

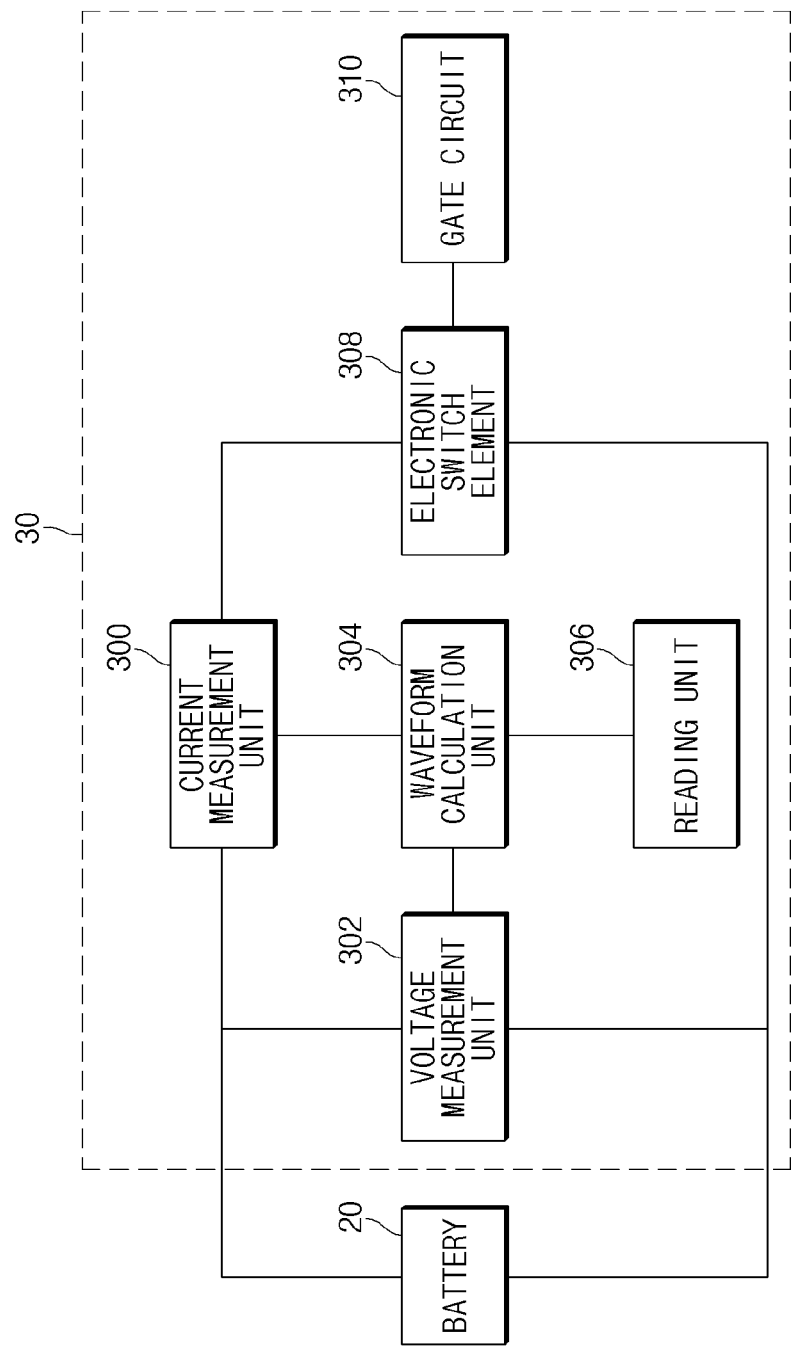
[FIG. 3]

[FIG. 4]
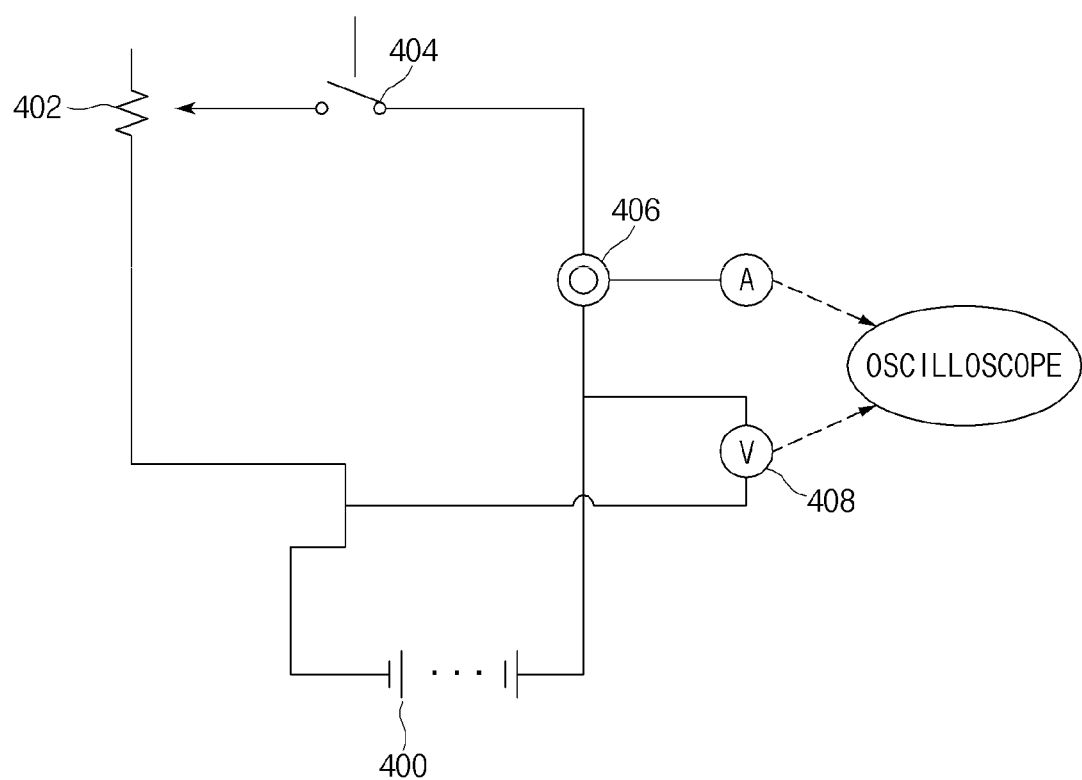

【FIG. 5A】
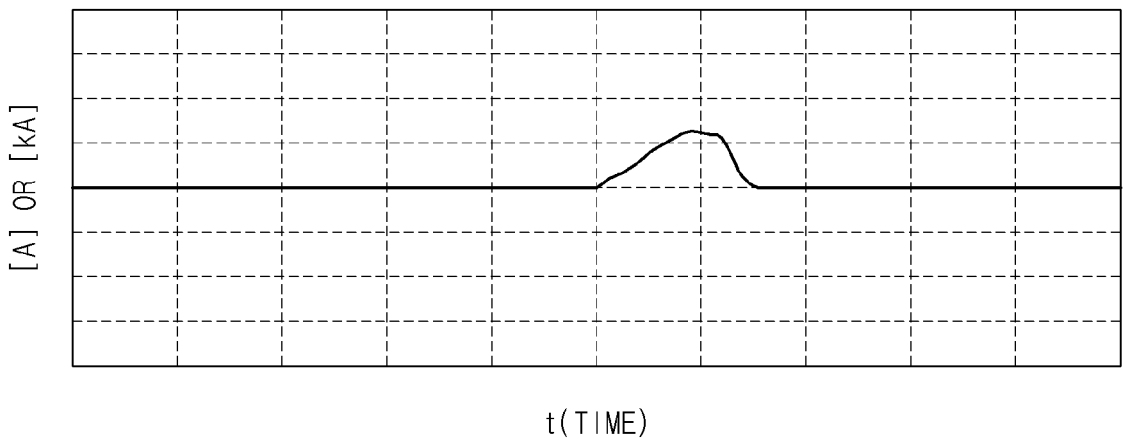
【FIG. 5B】
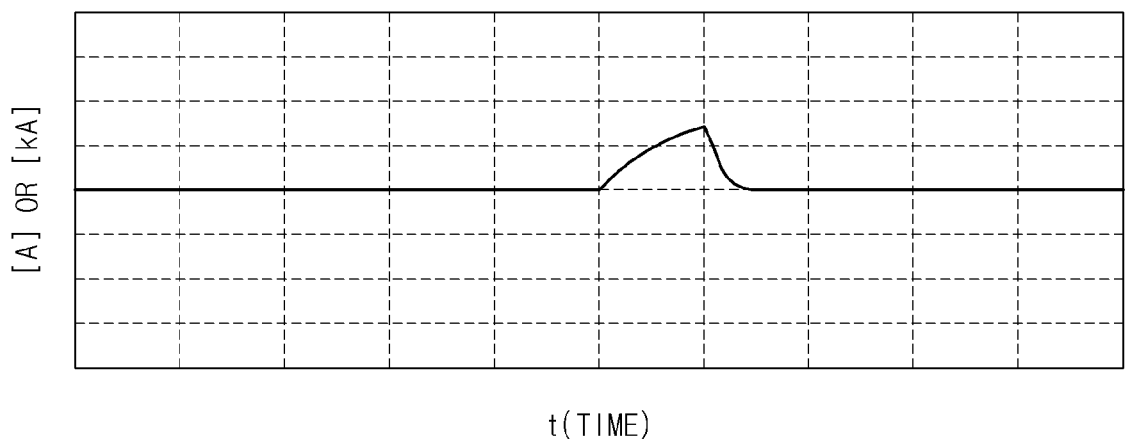

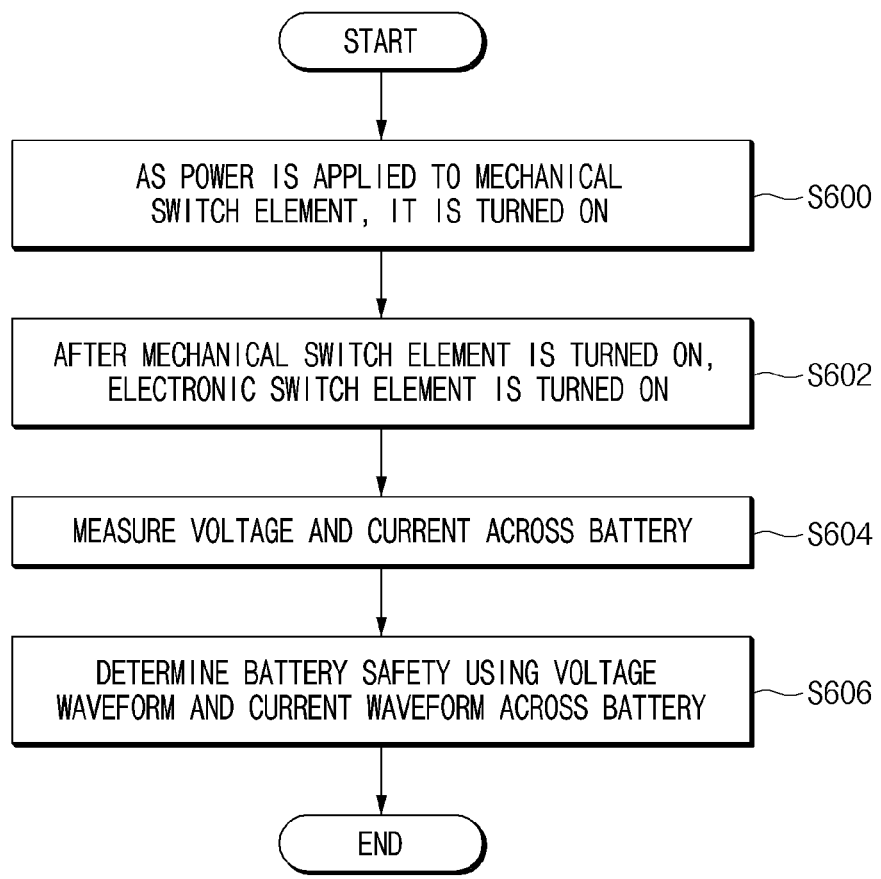

BATTERY SAFETY TEST DEVICE AND METHOD

MUTUAL CITATIONS WITH RELATED APPLICATIONS

This application is a Continuation of U.S. application Ser. No. 17/420,161, filed on Jul. 1, 2021 (now U.S. Pat. No. 11,909,009 issued on Feb. 20, 2024), which is the U.S. National Phase entry of PCT/KR2020/003652, filed Mar. 17, 2020 and which claims the benefit of priority based on Korean Patent Application No. 10-2019-0031403, filed on Mar. 19, 2019, all of which are herein expressly incorporated into the present specification.

TECHNICAL FIELD

Technology Field

The present invention relates to a battery safety test device and method.

Background Art

Recently, research and development on secondary batteries have been actively conducted. Here, the secondary batteries, as batteries that can be charged and discharged, mean that they include conventional Ni/Cd batteries and Ni/MH batteries, and recent lithium ion batteries. Among the secondary batteries, the lithium ion battery has an advantage that the energy density is much higher than that of the conventional Ni/Cd battery and Ni/MH battery, and further, the lithium ion battery can be manufactured with a tendency of a small size so that it is used as a power source for a mobile apparatus. In addition, the usage range of the lithium ion battery extends as a power source for electric vehicles, so that the lithium ion battery attracts attention as a next generation energy storage medium.

In addition, a secondary battery is generally used as a battery pack including a battery module in which a plurality of battery cells are connected in series and/or in parallel. And, a state and an operation of a battery pack are managed and controlled by a battery management system.

When using such a lithium ion battery, there is a possibility of an ignition accident, and therefore, safety tests are essential when using a lithium ion battery. Such safety tests include overcharge test, external short circuit test, discharge test, and internal short circuit test.

In the case of an external short circuit test, the presence or absence of burst ignition is evaluated when the both ends of the battery are short-circuited. In this case, when configuring an external short circuit for external short circuit test, mechanical contact relay is applied. Since the mechanical contact relay is a physical switch using a magnetic, there is a disadvantage that the reaction speed to the circuit is slow when opening and closing the mechanical contact relay. In addition, electrical noise, that is, chattering occurs in the contact connection step of the mechanical contact relay. The chattering phenomenon is a phenomenon in which vibration occurs when a contact such as a switch or relay is opened or closed.

DISCLOSURE

Technical Problem

An object of the present invention is to perform an accurate measurement and analysis of a battery current waveform generated during an external short circuit by removing a chattering phenomenon caused by the use of a mechanical contact relay when configuring an external short circuit test circuit.

Technical Solution

According to an embodiment of the present invention, a battery safety test device includes: an electronic switching element; a mechanical switch element having a first end connected to either a battery positive electrode or battery negative electrode and a second end connected to the electronic switching element; the electronic switching element has a first end connected to the mechanical switch element and a second end connected to the other of the battery positive electrode or the battery negative electrode; a voltage sensor configured to measure a voltage of the battery after the mechanical switch element and the electronic switching element are turned on; and a current sensor configured to measure a current of the battery after the mechanical switch element and the electronic switching element are turned on.

In the battery safety test device according to an embodiment of the present invention, the electronic switch element is configured to turn on after the mechanical switch element is turned on.

The battery safety test device according to an embodiment of the present invention further includes a variable resistor between the battery and the electronic switching element.

The battery safety test device according to an embodiment of the present invention further includes a DC power source configured to drive the mechanical switch element, wherein the mechanical switch element is a magnetic relay.

The battery safety test device according to an embodiment of the present invention further includes a gate circuit configured to drive the electronic switch element, wherein the electronic switch element is any one of a thyristor, MOSFET or IGBT.

The battery safety test device according to an embodiment of the present invention further includes a waveform calculator configured to calculate a voltage and current waveform of the battery using values measured by the voltage sensor and the current sensor after the mechanical switch element and the electronic switch element are turned on; and a reader configured to determine a safety of the battery using the voltage and current waveforms calculated by the waveform calculator.

In the battery safety test device according to an embodiment of the present invention, the current sensor is a Current Transfer (CT) sensor.

According to an embodiment of the present invention, a battery safety test method performed by a battery safety test device, the battery safety test device including: an electronic switching element; a mechanical switch element having a first end connected to either a battery positive electrode or a battery negative electrode and a second end connected to the electronic switching element; the electronic switching element having a first end connected to the mechanical switch element and a second end connected to the other of the battery positive electrode or the battery negative electrode; a voltage sensor; and a current sensor, the method includes: applying power to the mechanical switch element to turn on the mechanical switch element; turning on the electronic switch element after the mechanical switch element is turned on; and measuring a voltage of the battery, by the voltage sensor, and measuring a current across the battery, by the current sensor after the mechanical switch element and the electronic switch element are turned on.

In the battery safety test method according to an embodiment of the present invention, the mechanical switch element is a magnetic relay.

In the battery safety test method according to an embodiment of the present invention, the electronic switch element is any one of a thyristor, MOSFET or IGBT.

The battery safety test method according to an embodiment of the present invention further includes: calculating a voltage and current waveform of the battery using the measured voltage and current at both the battery positive electrode and the battery negative electrode; and determining a safety of the battery using the calculated voltage and current waveforms of the battery.

Advantageous Effects

The present invention has an effect that the chattering phenomenon can be eliminated to accurately measure and analyze a battery current waveform generated during an external short circuit by using an electronic switch element together with a mechanical contact relay when configuring an external short circuit test circuit.

DESCRIPTION OF DRAWINGS

FIG. 1 is a configuration diagram of a battery safety test device according to an embodiment of the present invention.

FIG. 2A is a simplified circuit diagram of a conventional battery safety test device.

FIG. 2B is a circuit diagram of a battery safety test device according to an embodiment of the present invention.

FIG. 2C is an embodiment of a gate circuit that applies a voltage to an electronic switch element.

FIG. 3 is a simplified configuration diagram of a battery safety test apparatus according to another embodiment of the present invention.

FIG. 4 is a circuit diagram of a battery safety test device according to another embodiment of the present invention.

FIG. 5A shows a battery short-circuit current waveform calculated by a battery safety inspection device according to the prior art.

FIG. 5B shows a battery short-circuit current waveform calculated by a battery safety inspection device according to an embodiment of the present invention.

FIG. 6 is a flowchart of a battery safety test method according to an embodiment of the present invention.

BEST MODE

Hereinafter, various embodiments of the present invention are disclosed with reference to the accompanying drawings. However, this is not intended to limit the invention to the specific embodiments, and it is to be understood that the invention includes various modifications, equivalents, and/or alternatives. With respect to the descriptions of the drawings, like reference numerals refer to like elements.

Terms used herein is for the purpose of describing particular example embodiments only and is not intended to be limiting of the scope of other embodiments. The terms of a singular form may include plural forms unless they have a clearly different meaning in the context. Otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood as having an ideal or excessively formal meaning. In any cases, even the terms defined in this specification cannot be interpreted as excluding embodiments of the present invention.

In addition, in describing the components of the embodiment of the present invention, terms such as first, second, A, B, (a), and (b) may be used. These terms are only to distinguish the components from other components, and the nature, sequence, or order of the components are not limited by the terms. In addition, when a component is described as being "connected to", "coupled to" or "linked to" another component, the components may be directly connected to or linked to each other but it should be understood that other components may be "connected", "coupled", or "linked" between each component.

FIG. 1 is a configuration diagram of a battery safety test device 10 according to an embodiment of the present invention.

The battery safety test device 10 is a device that is connected to both ends of the battery 20 to test the safety of the battery 20, and includes a current measurement unit 100, a voltage measurement unit 102, a waveform calculation unit (i.e., waveform calculator) 104, a reading unit (i.e., reader) 106, a mechanical switch element 108, a power unit 110, an electronic switch element 112, and a gate circuit 114.

The current measurement unit 100 measures the current of the battery 20. The current measurement unit 100 may be implemented as a current sensor, for example, a current transformer (CT) sensor. After the mechanical switch element 108 is turned on, and the electronic switch element 112 is turned on, the current measurement unit 100 may measure a current when the battery short circuit is in a short circuit state. The battery short-circuit current value measured by the current measurement unit 100 is transmitted to the waveform calculation unit 104. At this time, the current measurement unit 100 may measure the current using, for example, a shunt resistor instead of the CT sensor.

The voltage measurement unit 102 may be implemented as a voltage sensor, and measures the voltage at both ends of the battery 20. After the mechanical switch element 108 is turned on, and the electronic switch element 112 is turned on, the voltage measurement unit 102 measures the voltage while the battery short circuit is in a short circuit state. The battery voltage value measured by the voltage measurement unit 102 is transmitted to the waveform calculation unit 104.

After the mechanical switch element 108 and the electronic switch element 112 are turned on, the waveform calculation unit 104 calculates the short-circuit current waveform of the battery 20 using the short-circuit current value of the battery 20 measured from the current measurement unit 100. In addition, after the mechanical switch element 108 and the electronic switch element 112 are turned on, the waveform calculation unit 104 calculates the voltage waveform of the battery 20 using the voltage value measured from the voltage measurement unit 102.

The reading unit 106 determines the safety of the battery using the current waveform and/or voltage waveform calculated by the waveform calculation unit 104.

One end of the mechanical switch element 108 is electrically connected to one of the positive or negative electrodes of the battery 20 and the other end is electrically connected to the electronic switch element 112. In addition, one end of the mechanical switch element 108 may be connected to the current measurement unit 100. However, the mechanical switch element 108 is possible in any position where a short circuit can be formed when it is turned on. In addition, the mechanical switch element 108 is connected to the mechanical contact point when a voltage is applied. When an external signal for turning on the mechanical switch element 108 is received at the control terminal of the mechanical switch element 108, a voltage for contact connection is applied from the DC power unit 110. The mechanical switch element 108 may be, for example, a magnetic relay.

One end of the electronic switch element 112 is electrically connected to the mechanical switch element 108, and the other end is connected to the other of the positive or negative electrode of the battery 20. However, the electronic switch element 112 is possible in any position where a short circuit can be formed when it is turned on. Also, the electronic switch element 112 may be, for example, a thyristor, a MOSFET, or an insulated gate bipolar transistor (IGBT). The thyristor is a general term for a pnpn junction of a four-layer semiconductor device, and generally refers to a reverse-resistance three-terminal thyristor called SCR, and refers to a silicon-controlled rectifier device. In addition, the MOSFET is a metal oxide semiconductor field effect transistor, and is switched on when the voltage between the gate and the source exceeds a threshold voltage. The ICBT is a kind of power semiconductor, and has a fast operation speed and low power loss. After the mechanical switch element 108 is turned on, the electronic switch element 112 is turned on as voltage is applied from the gate circuit 114.

The gate circuit 114 receives a control signal from the outside and applies a voltage to the electronic switch element 112.

FIG. 2A is a simplified circuit diagram of a conventional battery safety test device.

A current measurement unit 211 (CT sensor) is connected to one end of the battery 201. A voltage meter 213 is connected to both ends of the battery 201. In addition, one end (i.e., a first end) of the variable resistor 203 is connected to the other end (one of a first end and a second end) of the battery 201. The resistance value of the variable resistor 203 is, for example, 5 to 95 mΩ. One end (i.e., a first end) of the mechanical switch element 205 is connected to the other end (i.e., a second end) of the variable resistor 203. The variable resistor 203 is a resistor for setting external resistance conditions.

In addition, the current measurement unit 211 is connected to the other end (i.e., a second end) of the mechanical switch element 205. On the other hand, the mechanical switch element 205 is connected in parallel with the switch 209 and the DC power source 207 connected in series with each other. When the switch 209 is turned on by a switch-on signal received from the outside, a voltage is applied to the mechanical switch element 205 to be turned on. Here, the mechanical switch element is, for example, a magnetic relay.

The mechanical switch element 205 connects a mechanical contact point as voltage is applied, and the reaction speed is slow. Also, when a voltage is applied to the mechanical switch element so that mechanical contacts are connected, there is a disadvantage that vibration may be caused by the physical connection. Due to this vibration, chattering occurs in a battery short-circuit current waveform when a short circuit is implemented. Chattering is a phenomenon caused by vibration that occurs when a switch or relay contact is opened or closed. In such a way, due to the short-circuit current waveform of the battery, it becomes difficult to perform accurate analysis for battery safety.

Subsequently, when the voltage is applied to the mechanical switch element 205, a short circuit is formed to conduct the battery current. The CT sensor 211 measures battery current. The battery current value measured by the CT sensor 211 is transmitted to the oscilloscope. The oscilloscope calculates the battery current waveform using the transmitted battery current value.

In addition, the voltage meter 213 measures the battery voltage. The voltage meter 213 transmits the measured battery voltage value to the oscilloscope. The battery voltage waveform is calculated using the battery voltage value transmitted to the oscilloscope.

The safety of the battery is determined using the battery current and voltage waveforms calculated by the oscilloscope. However, as mentioned above, chattering occurs due to vibration generated when the mechanical switch element 205 is opened or closed, so it is difficult to accurately determine the safety of the battery. In order to compensate for this, in one embodiment of the present invention, an electronic switch element was added. Detailed description will be made later.

FIG. 213 is a circuit diagram of a battery safety test device according to an embodiment of the present invention.

The CT sensor 212 is connected to one end (i.e., a first end) of the battery 200. A voltage meter 214 is connected to both ends of the battery 200. In addition, one end (i.e., a first end) of the variable resistor 202 is connected to the other end (i.e., a second end) of the battery 200. The resistance value of the variable resistor 202 is, for example, 5 to 95 mΩ. However, the resistance value of the variable resistor 202 is exemplary, and the range may vary according to the specification of the battery 200. One end (i.e., a first end) of the mechanical switch element 206 is connected to the other end (i.e., a second end) of the variable resistor 202. That is, the variable resistor 202 may be connected between the battery 200 and the electronic switching element 204 as a resistor for setting an external resistance condition.

Also, the other end (i.e., a second end) of the mechanical switch element 206 is connected to the CT sensor 212. Meanwhile, the mechanical switch element 206 is connected in series with the switch 209 and the DC power source 207. When the switch 209 is turned on by a switch-on signal received from the outside, a voltage is applied to the mechanical switch element 206 to be turned on. Here, the mechanical switch element 206 is, for example, a magnetic relay. The present invention is not limited thereto and any known mechanical switch element that can be replaced with the present invention component can be used.

One embodiment of the present invention further includes an electronic switch element 204 in series with the mechanical switch element 206. The electronic switch element 204 can be, for example, a thyristor, MOSFET or IGBT. After the mechanical switch element 206 is turned on, the electronic switch element 204 is turned on as voltage is applied from the gate circuit.

When the mechanical switch element 206 and the electronic switch element 204 are both turned on, current flows in the battery short circuit. The CT sensor 212 measures the current flowing through the battery short circuit and transmits it to the oscilloscope.

In addition, when both the mechanical switch element 206 and the electronic switch element 204 are turned on, the voltage meter 214 measures the voltage across the battery. The voltage value across the battery measured by the voltage meter 214 is transmitted to the oscilloscope.

The voltage or current waveform is calculated using the voltage and current values across the battery transmitted to the oscilloscope.

The safety of the battery is determined using the calculated voltage waveform or current waveform.

FIG. 2C is an embodiment of a gate circuit that applies a voltage to an electronic switch element.

The gate circuit 221 includes an electronic switch element driving power source 220, a first resistor 222, a driving switch element 223, a second resistor 224, and a capacitor 226.

The electronic switch element driving power source 220 is a DC power source, and may be, for example, 12 V or 24 V. When the driving switch element 223 is turned on, a voltage is applied from the electronic switch element driving power source 220 to the electronic switch element 228.

One end of the first resistor 222 is electrically connected to one end of the electronic switch element driving power source 220, and the other end of the first resistor 222 is connected to one end of the second resistor 224 and one end of the capacitor 226 to form a low pass filter. The first resistor 222, the second resistor 224, and the capacitor 226 function as a low-pass filter to remove high-frequency components. However, the filter included in the gate circuit 221 may be variously changed using passive components R, L, and C as well as the configuration shown in FIG. 2C.

FIG. 3 is a simplified configuration diagram of a battery safety test device 30 according to another embodiment of the present invention.

The battery safety test device 30 includes a current measurement unit 300, a voltage measurement unit 302, a waveform calculation unit 304, a reading unit 306, an electronic switch element 308, and a gate circuit 310.

The current measurement unit 300 measures the current of the battery 20. The current measurement unit 300 may be implemented as a current sensor, for example, a CT sensor. After the electronic switch element 308 is turned on, as the battery short circuit is shorted, the current measurement unit 300 can measure the current. The battery short-circuit current value measured by the current measurement unit 300 is transmitted to the waveform calculation unit 304. At this time, the current measurement unit 300 may measure the current using a shunt resistor instead of the CT sensor.

The voltage measurement unit 302 may be implemented as a voltage sensor, and measures the voltage at both ends of the battery 20. The voltage measurement unit 302 measures the voltage across the battery after the electronic switch 308 is turned on. The battery voltage value measured by the voltage measurement unit 302 is transmitted to the waveform calculation unit 304.

After the mechanical switch element 108 and the electronic switch element 112 are turned on, the waveform calculation unit 304 calculates the short-circuit current waveform of the battery 20 using the short-circuit current value of the battery 20 measured from the current measurement unit 300. In addition, after the mechanical switch element 108 and the electronic switch element 112 are turned on, the waveform calculation unit 304 calculates the short-circuit voltage waveform of the battery 20 using the voltage value measured from the voltage measurement unit 302.

The reading unit 306 determines the safety of the battery using the current waveform and/or voltage waveform calculated by the waveform calculation unit 304. The method of determining the safety of the battery using the short-circuit current waveform and/or voltage waveform of the battery is a known technique, and those skilled in the art can easily recognize the method, so that a detailed description thereof will be omitted.

One end of the electronic switch element 308 is electrically connected to the current measurement unit 300 and the other end is electrically connected to either the positive or negative electrode of the battery 20. However, the electronic switch element 308 is possible in any position where a short circuit can be formed when it is turned on. Also, the electronic switch element 308 may be, for example, a thyristor, MOSFET, or IGBT.

The gate circuit 310 receives a control signal from the outside and applies a voltage to the electronic switch element 308.

FIG. 4 is a circuit diagram of a battery safety test device according to another embodiment of the present invention.

The CT sensor 406 is connected to one end of the battery 400. In addition, a voltage meter 408 is connected to both ends of the battery 400. In addition, one end of the variable resistor 402 is electrically connected to either the positive or negative electrode of the battery 400. The variable resistance value is, for example, 5 to 95 mΩ. However, the resistance value of the variable resistor 402 is exemplary, and the range may vary according to the specification of the battery 200. The variable resistor is a resistor for setting external resistance conditions, and may be connected between the battery 400 and the electronic switch element 404.

In addition, the other end of the electronic switch element 404 is connected to the CT sensor 406. On the other hand, when a voltage is applied from the gate circuit by an external control signal, the electronic switch element 404 is turned on. The electronic switch element 404 usable in this embodiment may be a MOSFET or IGBT that can be turned on/off depending on whether a gate voltage is applied.

When all of the electronic switch elements 404 are turned on, current flows in the battery short circuit. The CT sensor 406 measures the current flowing through the battery short circuit and transmits it to the oscilloscope.

In addition, when all of the electronic switch elements 404 are turned on, the voltage meter 408 measures the voltage across the battery. The voltage value across the battery measured by the voltage meter 408 is transmitted to the oscilloscope.

The oscilloscope calculates a voltage waveform or a current waveform using the transmitted voltage and current values across the battery.

The safety of the battery is determined using the calculated voltage waveform or current waveform. The method of determining the safety of the battery using the short-circuit current waveform or voltage waveform of the battery is a known technique, and those skilled in the art can easily recognize the method, so that a detailed description thereof will be omitted.

FIG. 5A shows a battery short-circuit current waveform calculated by a battery safety inspection device according to the prior art.

In relation to the battery short-circuit current waveform calculated by the battery safety test device shown in FIG. 2A, the peak portion of the short-circuit current waveform is distorted due to chattering.

FIG. 5B shows a battery short-circuit current waveform calculated by a battery safety inspection device according to an embodiment of the present invention.

Unlike the current waveform shown in FIG. 5A, in relation to the battery short-circuit current waveform calculated by the battery safety test device according to an embodiment of the present invention shown in FIG. 2/3, the chattering phenomenon was eliminated, so that the peak portion of the current waveform was not distorted. Therefore, it is possible to more accurately perform the battery safety test using the short-circuit current waveform.

FIG. 6 is a flowchart of a battery safety test method according to an embodiment of the present invention. The configuration will be described with reference to FIG. 1.

When power is supplied from the power unit 110 to the mechanical switch element 108 in which one end is electrically connected to either the positive or negative electrode of the battery 20, and the other end is electrically connected to the electronic switch element 112, the mechanical switch element 108 is turned on. That is, the power is applied to the mechanical switch element 108 (S600).

The mechanical switch element 108 can be, for example, a magnetic relay.

After the mechanical switch element 108 is turned on, a voltage is applied by the gate circuit 114 to turn on the electronic switch element (S602). Here, one end of the electronic switch element 112 is connected to the mechanical switch element 108, and the other end is connected to either the positive or negative electrode of the battery 20. However, the electronic switch element 112 is possible in any position where a short circuit can be formed when it is turned on. Also, the electronic switch element 108 may be, for example, a thyristor, MOSFET, or IGBT. In addition, the gate circuit 114 receives a control signal from the outside and applies a voltage to the electronic switch element 112.

After the mechanical switch element 108 and the electronic switch element 112 are turned on, the current measurement unit 100 measures the battery short-circuit current. In addition, the voltage measurement unit 102 measures the battery voltage after the mechanical switch element 108 and the electronic switch element 112 are turned on (S604).

The battery short-circuit current value measured by the current measurement unit 100 is transmitted to the waveform calculation unit 104, and the battery voltage value measured by the voltage measurement unit 102 is also transmitted to the waveform calculation unit 104. The waveform calculation unit 104 calculates the battery current waveform or voltage waveform using the received battery short-circuit current value and voltage value. The calculated current waveform or voltage waveform is transmitted to the reading unit 106.

The reading unit 106 determines the battery safety using the received battery short-circuit current waveform and voltage waveform (S606).

Reference herein to 'one embodiment' of the principles of the present invention and various modifications of such expressions means that, in relation to this embodiment, the specific features, structures, characteristics, and the like are included in at least one embodiment of the principles of the present invention. Thus, the expression 'in one embodiment' and any other modifications disclosed throughout the specification are not necessarily all referring to the same embodiment.

All the embodiments and conditional examples disclosed in this specification are described to intend to help those skilled in the art to understand the principles and concepts of the present invention, so that it will be understood by those skilled in the art that various changes in form and details may be made therein without departing from the spirit and scope of the present invention. Therefore, the disclosed embodiments should be considered in descriptive sense only not in limited perspective sense. The scope of the invention is defined not by the detailed description of the invention but by the appended claims, and all differences within the scope will be construed as being included in the present invention.

What is claimed is:

1. A battery safety test device, comprising:
an electronic switch element;
a mechanical switch element having a first end connected to either a battery positive electrode or a battery negative electrode and a second end connected to the electronic switch element;
wherein the electronic switch element has a first end connected to the mechanical switch element and a second end connected to the other of the battery positive electrode or the battery negative electrode;
a voltage sensor configured to measure a voltage of the battery after the mechanical switch element and the electronic switch element are turned on;
a current sensor configured to measure a current of the battery after the mechanical switch element and the electronic switch element are turned on;
a waveform calculator configured to calculate a voltage and current waveforms of the battery using values measured by the voltage sensor and the current sensor after the mechanical switch element and the electronic switch element are turned on; and
a reader configured to determine that the battery is short-circuited when the calculated current waveform has a distorted peak portion.

2. The device of claim 1, wherein the electronic switch element is configured to turned on after the mechanical switch element is turned on.

3. The device of claim 1, further comprising a variable resistor between the battery and the electronic switch element.

4. The device of claim 1, further comprising a DC power source configured to drive the mechanical switch element, wherein the mechanical switch element is a magnetic relay.

5. The device of claim 1, further comprising a gate circuit configured to drive the electronic switch element, wherein the electronic switch element is any one of a thyristor, MOSFET or IGBT.

6. The device of claim 1, wherein the current sensor is a Current Transfer (CT) sensor.

7. The device of claim 1, wherein the waveform calculator calculates the voltage and current waveforms using a short-circuit current value of the current of the battery and a voltage value of the voltage of the battery.

8. A battery safety test method performed by a battery safety test device, the battery safety test device including:
an electronic switch element;
a mechanical switch element having a first end connected to either a battery positive electrode or a battery negative electrode and a second end connected to the electronic switching element,
wherein the electronic switch element has a first end connected to the mechanical switch element and a second end connected to the other of the battery positive electrode or the battery negative electrode;
a voltage sensor; and
a current sensor, and
the method comprising:
applying power to the mechanical switch element to turn on the mechanical switch element;
turning on the electronic switch element after the mechanical switch element is turned on;
measuring a voltage of the battery, by the voltage sensor, and measuring a current across the battery, by the current sensor, after the mechanical switch element and the electronic switch element are turned on;

calculating a voltage and current waveforms of the battery using the measured voltage and the current at both the battery positive electrode and the battery negative electrode; and determining that the battery is short-circuited when the calculated current waveform has a distorted peak portion.

9. The method of claim 8, wherein the mechanical switch element is a magnetic relay.

10. The method of claim 8, wherein the electronic switch element is any one of a thyristor, MOSFET or IGBT.

11. The method of claim 8, wherein the calculating of the voltage and the current waveforms are performed using a short-circuit current value of the current of the battery and a voltage value of the voltage of the battery.

* * * * *